(12) United States Patent
Chen et al.

(10) Patent No.: US 6,291,964 B1
(45) Date of Patent: Sep. 18, 2001

(54) MULTIPLE POWER SOURCE ELECTROSTATIC DISCHARGE PROTECTION CIRCUIT

(75) Inventors: Shiao-Shien Chen, Tao-Yuan Hsien; Tien-Hao Tang, Taipei Hsien, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/489,463

(22) Filed: Jan. 21, 2000

(51) Int. Cl.[7] .................................................. H02H 9/00
(52) U.S. Cl. ............................................................ 320/56
(58) Field of Search ............................ 361/56, 111, 91.1, 361/118, 58

(56) References Cited

U.S. PATENT DOCUMENTS

| | | | |
|---|---|---|---|
| 5,745,323 | * 4/1998 | English et al. | 361/56 |
| 5,870,268 | * 2/1999 | Lin et al. | 361/111 |
| 5,883,540 | * 3/1999 | Kwon | 327/379 |
| 6,091,594 | * 7/2000 | Williamson et al. | 361/111 |

* cited by examiner

Primary Examiner—Edward H. Tso
(74) Attorney, Agent, or Firm—Thomas, Kayden, Horstemeyer & Risley, LLP

(57) ABSTRACT

A multiple power source electrostatic discharge (ESD) protection circuit installed between a bonding pad and an internal circuit. The ESD protection circuit includes five NMOS transistors and a PMOS transistor. The source terminals of the first and the third NMOS transistor are grounded. The gate terminals of the second and the fourth NMOS transistor are connected to a first voltage source. The gate terminals of the third and the fifth NMOS transistor are connected to a second voltage source. The drain terminals of the first NMOS and the PMOS transistor are connected to the bonding pad. The drain terminal of the third NMOS transistor is connected to the source terminal of the second NMOS transistor. The drain terminal of the fourth NMOS transistor and the source terminal of the PMOS transistor are connected to a voltage source pad. The drain terminal of the fifth NMOS transistor is connected to the source terminal of the fourth NMOS transistor while the source terminal of the fifth NMOS transistor is connected to the gate terminal of the PMOS transistor. The voltage source pad is connected to the first or the second voltage source. The invention utilizes a pair of charge-coupled parasitic capacitors to improve ESD protection.

3 Claims, 2 Drawing Sheets

MULTIPLE POWER SOURCE ELECTROSTATIC DISCHARGE PROTECTION CIRCUIT

BACKGROUND OF THE INVENTION

1. Field of the Invention

The present invention relates to an electrostatic discharge (ESD) protection circuit. More particularly, the present invention relates to a multiple power source ESD protection circuit that operates through charge coupling.

2. Description of the Related Art

Failure of integrated circuit (IC) such as dynamic random access memory (DRAM) or static random access memory (SRAM) is often caused by electrostatic discharge during manufacturing or subsequent handling. For example, several hundred to several thousand volts can be generated when a person walks over a carpet, even if the surrounding relative humidity is high. When the relative humidity is low, more than ten thousand volts can be generated. If the electrified person touches a product chip, static electricity may suddenly discharge through the chip and result in chip failure. Hence, to prevent damages to silicon chip due to electrostatic discharge, various circuit protection methods are developed. The most common method of protecting against ESD is to install an on-chip ESD protection circuit between a bonding pad and connected internal circuit.

Since thickness of a gate oxide layer is reduced with an increase in the level of integration. the gate oxide layer will break down at the breakdown voltage at the source/drain junction or even lower. Under such circumstances, effectiveness of the original ESD protection circuit is greatly compromised. In addition, internal circuits are generally designed according to minimum design rules. The ESD protection circuit is not designed to withstand the large transient current produced in an electrostatic discharge (because sufficient separation must be allowed from a contact to the edge of the diffusion region and the gate region). Thus, high-level integrated circuits on a silicon chips are exceptionally vulnerable to electrostatic discharge. Consequently, ESD is one of the leading causes of failure in deep-submicron devices.

A conventional charge-coupled ESD protection circuit utilizes the coupled charges in an electrostatic discharge to increase the voltage in a floating gate and trigger the opening of a parasitic diode. Ultimately, the sudden current surge due to ESD is channeled away and the internal circuit inside the silicon chip is protected. However, due to the presence of a parasitic diode, effectiveness of the positive voltage stress to ground line Vss and the negative voltage stress to voltage source Vdd type of conventional charge-coupled ESD protection circuit is diminished.

FIG. 1 is a schematic diagram of a conventional ESD charge-coupled protection circuit. As shown in FIG. 1, the ESD charge-coupled protection circuit 10 is installed between a bonding pad 12 and an internal circuit 14. The protection circuit 10 includes two N-type metal-oxide-semiconductor (NMOS) transistors 16 and 18 and two P-type metal-oxide-semiconductor (PMOS) transistors 20 and 22. The source terminal of the NMOS transistor 16 is grounded (via a ground line Vss); the gate terminal is connected to the drain terminal of the NMOS transistor 18; and the source terminal is connected to the bonding pad 12. The source terminal of the NMOS transistor 18 is connected to the ground line Vss and the gate terminal is connected to a voltage source Vdd. The source terminal of the PMOS transistor 20 is connected to the voltage source Vdd; the gate terminal is connected to the drain terminal of the PMOS transistor 22; and the drain terminal is connected to the bonding pad 12. The source terminal of the PMOS transistor 22 is connected to the voltage source Vdd and the gate terminal is connected to the ground line Vss.

In normal operation, the gate terminal of the NMOS transistor 18 and the gate terminal of the PMOS transistor 22 are connected to the voltage source Vdd and the ground line Vss, respectively. Hence, both transistors 18 and 22 are turned on. The gate of the NMOS transistor 16 and the gate of the PMOS transistor 20 are in a non-floating state. Hence, both transistors 16 and 20 are turned off. Under such circumstances, there is no charge coupling.

When there is electrostatic discharge (ESD), using a positive stress as an example, since the voltage source Vdd is in a floating state (an abnormal operating condition), the NMOS transistor 18 is turned off. Within a very short time, the gate terminal is in a floating state. Hence, the positive stress voltage applied to the bonding pad 12 couples with the gate terminal of the NMOS transistor 16 through a parasitic capacitor 24 between the drain and the gate terminal of the NMOS transistor 16. The coupling of the parasitic capacitor 24 triggers the NMOS transistor 16 so that the positive stress voltage is discharged through a ground line Vss via the NMOS transistor 16.

Due to the forward bias of the parasitic diode 26 of the PMOS transistor 20, a positive stress voltage applied to the bonding pad 12 is fed back to the gate terminal of the NMOS transistor 18 via the parasitic diode 26 and the voltage source Vdd. Hence, the NMOS transistor 18 is turned on. Therefore, the degree of charge coupling decreases and the capacity for ESD protection deteriorates. Similarly, a negative stress voltage applied to the bonding pad 12 is fed back to the voltage source Vdd.

SUMMARY OF THE INVENTION

Accordingly, one object of the present invention is to provide a multiple power source ESD protection circuit between a bonding pad and an internal circuit that has a higher circuit protection capacity than a conventional circuit.

To achieve these and other advantages and in accordance with the purpose of the invention, as embodied and broadly described herein, the invention provides a multiple power source electrostatic discharge (ESD) protection circuit. The ESD protection circuit is installed between a bonding pad and an internal circuit. The FSD protection circuit includes five NMOS transistors and a PMOS transistor. The source terminal of a first NMOS transistor is grounded and the drain terminal of the first NMOS transistor is connected to a bonding pad. The drain terminal of the second NMOS transistor is connected to the gate terminal of the first NMOS transistor, and the gate terminal of the second NMOS transistor is connected to a first voltage source. The drain terminal of the third NMOS transistor is connected to the source terminal of the second NMOS transistor the gate terminal of the third NMOS transistor is connected to a second voltage source and the drain terminal of the third NMOS transistor is grounded. The drain terminal of the fourth NMOS transistor is connected to a voltage source pad and the gate terminal of the fourth NMOS transistor is connected to the first voltage source. The drain terminal of the fifth NMOS transistor is connected to the source terminal of the fourth NMOS transistor and the gate terminal of the fifth NMOS transistor is connected to the second voltage source. The source terminal of the PMOS transistor is connected to the voltage source pad, the gate terminal of the PMOS transistor is connected to source terminal of the fifth NMOS transistor and the drain terminal of the PMOS transistor is connected to the bonding pad. The voltage source pad is connected to either the first voltage source or the second voltage source.

The multiple power source ESD protection circuit of this invention has a higher circuit protection capacity than a conventional circuit. This is because whether a positive voltage stress is applied to ground or a negative voltage stress is applied to the voltage source pad, the parasitic diode of both the PMOS transistor and the first NMOS transistor is not affected by the actual states at their gate terminals. In fact, the gate terminals of both the first NMOS transistor and the PMOS transistor are in a floating state. The charge-coupling capacity of the parasitic capacitors between the drain terminal and the gate terminal of both the first NMOS transistor and the PMOS transistor can be utilized to activate the parasitic bipolar carriers of the first NMOS transistor and the PMOS transistor so that the transistors are turned on much earlier. Hence, the protective capacity of the ESD protection circuit is also increased.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
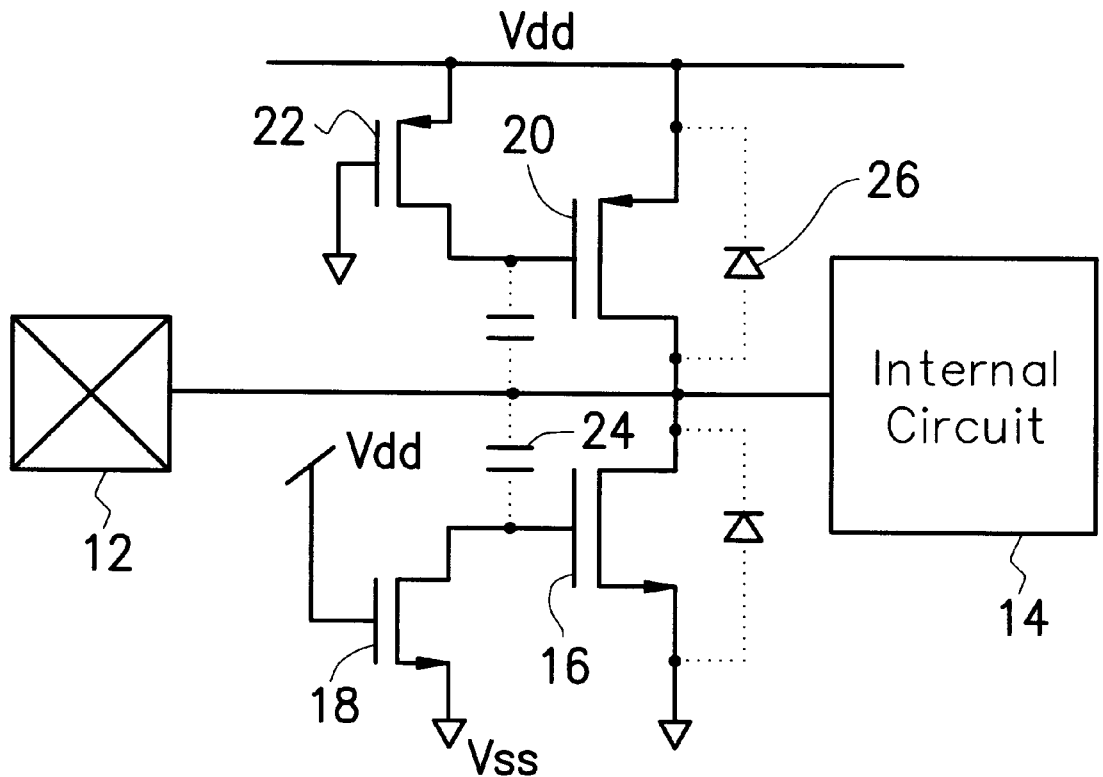
FIG. 1 is a schematic diagram of a conventional ESD charge-coupled protection circuit.

Reference will now be made in detail to the present preferred embodiments of the invention, examples of which are illustrated in the accompanying drawings. Wherever possible, the same reference numbers are used in the drawings and the description to refer to the same or like parts.

Figure 2:
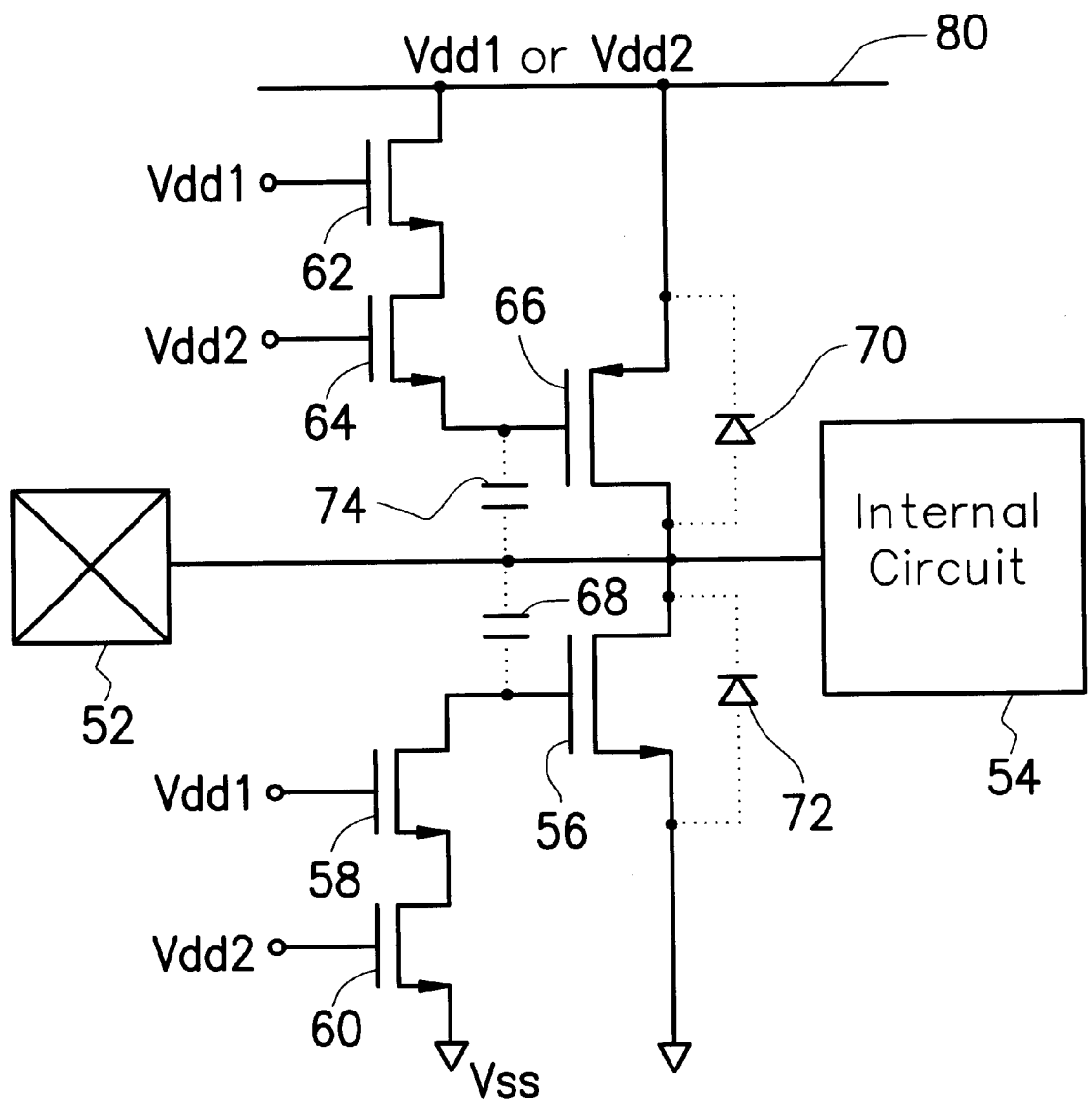
FIG. 2 is a schematic diagram of a multiple power source ESD protection circuit according to one preferred embodiment of this invention.

FIG. 2 is a schematic diagram of a multiple power source ESD protection circuit according to one preferred embodiment of this invention. In this invention, charge coupling by a parasitic capacitor is used to improve the ESD protective capacity of the circuit.

As shown in FIG. 2, the ESD protection circuit 50 is installed between a bonding pad 52 and an internal circuit 54. The circuit 50 includes five NMOS transistors 56, 58, 60. 62 and 64 and one PMOS transistor 66. The source terminal of the NMOS transistor 56 is connected to a ground line Vss, the gate terminal of the NMOS transistor 56 is connected to the drain of the NMOS transistor 58 and the drain terminal of the NMOS transistor 56 is connected to the bonding pad 52. The source terminal of the NMOS transistor 58 is connected to the drain of the NMOS transistor 60, and the gate terminal of the NMOS transistor 58 is connected to a first voltage source Vdd1. The source terminal of the NMOS transistor 60 is connected to the ground line Vss, and the gate terminal of the NMOS transistor 60 is connected to a second voltage source Vdd2. The source terminal of the PMOS transistor 66 is connected to a voltage source pad 80, the gate terminal of the PMOS transistor 66 is connected to the source terminal of the NMOS transistor 64, and the drain terminal of the PMOS transistor 66 is connected to the bonding pad 52. The voltage source pad 80 can connect with either the first voltage source Vdd1 or the second voltage source Vdd2. The drain terminal of the NMOS transistor 62 is connected to the voltage source pad 80, the gate terminal of the NMOS transistor 62 is connected to the first voltage source Vdd1, and the source terminal of the NMOS transistor 62 is connected to the drain terminal of the NMOS transistor 64. The gate terminal of the NMOS transistor 64 is connected to the second voltage source Vdd2.

In normal operation, since the gate terminal of both the NMOS transistor 58 and 62 are connected to the first voltage source Vdd1 and the gate terminal of both the NMOS transistors 60 and 64 are connected to the second voltage source Vdd2. Therefore, both the NMOS transistor 56 and the PMOS transistor 66 are turned off.

In an ESD incident such as the application of a positive voltage stress to Vss, the first voltage source Vdd1, the second voltage source Vdd2 and the voltage source pad 80 (can be Vdd1 or Vdd2) are turned into a floating state (under abnormal operation conditions). Therefore, the NMOS transistors 58 and 60 are turned off and the NMOS transistor 56 shuts down within a very short interval turning its gate terminal into a floating state. The positive stress voltage applied through the bonding pad 52 is coupled to the gate terminal of the NMOS transistor 56 through a parasitic capacitor 68 between the drain terminal and the gate terminal of the NMOS transistor 56. Consequently, parasitic bipolar is triggered quickly such that the positive stress voltage on the bonding pad 52 can be discharged to the ground via the NMOS transistor 56.

On the other hand, since the parasitic diode 70 across the source and drain terminal of the PMOS transistor 66 has a forward bias, the positive stress voltage on the bonding pad 52 can discharge to the voltage source pad 80.

In addition, the current flowing to the voltage source pad 80 due to the positive stress voltage is transferred to the gate terminal of the NMOS transistor 58 (if the supply voltage is Vdd1) or the gate terminal of the NMOS transistor 60 (if the supply voltage is Vdd2). Hence, only one of the NMOS transistors 58 or 60 is turned on by the coupled parasitic diode 70. Since there is no effect on the NMOS transistor 56, the gate terminal of the NMOS transistor 56 is still in a floating state. Therefore, the circuit structure of this invention is able to turn on the NMOS transistor 56 much earlier through the charge coupling of the parasitic capacitor 68 so that a higher ESD protection capacity is achieved.

A similar sequence of events occurs when a negative stress voltage is applied to the voltage source pad. When a negative stress ESD occurs, the parasitic diode 72 of the NMOS transistor 56 provides an electric discharge pathway. In addition, since the ground line Vss is in a floating state, both NMOS transistors 62 and 64 are unaffected by the coupling of parasitic diode 72. In other words, the pathway from the voltage source pad 80 (can be connected to Vdd1 or Vdd2) to the gate terminal of the PMOS transistor 66 is not yet closed when a negative stress is present. Ultimately, the gate terminal of the PMOS transistor 66 is still in a floating state. Therefore, the circuit structure of this invention is able to provide an early turn on of the PMOS transistor 66 through the charge coupling of the parasitic capacitor 74 so that a higher ESD protection capacity is achieved.

In summary, whether a positive voltage stress is applied to ground line Vss or a negative voltage stress is applied to the voltage source pad 80, both the gate terminal of the NMOS transistor 56 and the PMOS transistor 66 are unaffected by what happens at the parasitic diodes 70 and 72. The gate terminal of both the NMOS transistor 56 and the PMOS transistor 66 remains in a floating state. Hence, utilizing the charge coupled parasitic capacitors 68 and 74 to turn on the NMOS transistor 56 and the PMOS transistor 66, capacity of the ESD protection circuit in this invention is improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A multiple power source electrostatic discharge protection circuit installed between a bonding pad and an internal circuit, comprising:

a first NMOS transistor whose source terminal is grounded and whose drain terminal is connected to the bonding pad;

a second NMOS transistor whose drain terminal is connected to a gate terminal of the first NMOS transistor and whose gate terminal is connected to a first voltage source;

a third NMOS transistor whose drain terminal is connected to a source terminal of the second NMOS transistor, whose gate terminal is connected to a second voltage source and whose source terminal is grounded;

a fourth NMOS transistor whose drain terminal is connected to a voltage source pad and whose gate terminal is connected to the first voltage source;

a fifth NMOS transistor whose drain terminal is connected to a source terminal of the fourth NMOS transistor and whose gate terminal is connected to the second voltage source; and a PMOS transistor whose source terminal is connected to the voltage source pad, whose gate terminal is connected to a source terminal of the fifth NMOS transistor and whose drain terminal is connected to the bonding pad.

2. The multiple power source electrostatic discharge protection circuit of claim 1, wherein the voltage source pad is coupled to the first voltage source.

3. The multiple power source electrostatic discharge protection circuit of claim 1. wherein the voltage source pad is coupled to the second voltage source.

* * * * *